United States Patent
Theivendran et al.

(10) Patent No.: US 10,824,783 B2
(45) Date of Patent: Nov. 3, 2020

(54) APPROACH FOR LOGIC SIGNAL GROUPING AND RTL GENERATION USING XML

(71) Applicant: Xpliant, San Jose, CA (US)

(72) Inventors: Premshanth Theivendran, Foster City, CA (US); Weihuang Wang, Los Gatos, CA (US); Guy Hutchison, Santa Clara, CA (US); Gerald Schmidt, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 377 days.

(21) Appl. No.: 14/675,403

(22) Filed: Mar. 31, 2015

(65) Prior Publication Data

US 2016/0292330 A1 Oct. 6, 2016

(51) Int. Cl.
| | |
|---|---|
| *G06F 17/50* | (2006.01) |
| *G06F 30/33* | (2020.01) |
| *G06F 30/30* | (2020.01) |
| *G06F 30/327* | (2020.01) |

(52) U.S. Cl.
CPC ............. *G06F 30/33* (2020.01); *G06F 30/30* (2020.01); *G06F 30/327* (2020.01)

(58) Field of Classification Search
CPC ......... G06F 17/5045; G06F 2212/1041; G06F 30/33; G06F 30/30; G06F 30/327
USPC ................. 716/100–103, 106, 117
See application file for complete search history.

(56) References Cited

U.S. PATENT DOCUMENTS

| | | | | |
|---|---|---|---|---|
| 7,131,077 | B1 * | 10/2006 | James-Roxby | G06F 17/5054 716/103 |
| 2006/0129368 | A1 * | 6/2006 | Smith | G06F 17/5022 703/14 |
| 2006/0259884 | A1 * | 11/2006 | Fong | G06F 17/5022 716/102 |
| 2008/0077906 | A1 * | 3/2008 | Bowyer | G06F 17/5045 716/102 |
| 2010/0146338 | A1 * | 6/2010 | Schalick | G06F 11/3692 714/33 |
| 2010/0235803 | A1 * | 9/2010 | Gramark | G06F 17/5045 716/126 |
| 2013/0185682 | A1 * | 7/2013 | Nayak | G06F 17/5045 716/102 |

* cited by examiner

*Primary Examiner* — Nghia M Doan

(57) ABSTRACT

Systems and methods for generating an RTL description based on logical signal groupings are described. Logical interfaces are declared in a compressed form, and logical signal grouping is defined in a markup document. The definitions from the markup document are used by expansion scripts to populate RTL modules and encapsulate block connectivity and functionality. Multiple interfaces can be created instantly, and interface definitions for common interfaces may be easily re-defined. Default values may be assigned to module outputs for testing purposes, allowing for multi-module simulations where certain modules are shelled-out.

25 Claims, 8 Drawing Sheets

```
// 2-1 arbiter Interface definition
module arbiter
(
   // 2-1 arbiter Interface definition
   //~~   name="Sample Interface"    type=dummy_interface
inv=no   num_inst=2  moda=datapath@   modb=arbiter
   //~~   name="Sample Interface"    type=dummy_interface
inv=no   num_inst=1  moda=arbiter     modb=controlpath //          <<<< AUTO GENERATED HEADER BEGIN >>>>
   // Instance: 0
   output
datapath0_arbiter_vld,
   input
datapath0_arbiter_fc_n,
   output XP_TOKEN_S
datapath0_arbiter_token, // Instance: 1
   output
datapath1_arbiter_vld,
   input
datapath1_arbiter_fc_n,
   output XP_TOKEN_S
datapath1_arbiter_token, // Instance: 0
   output
arbiter_controlpath_vld,
   input
arbiter_controlpath_fc_n,
   output XP_TOKEN_S
arbiter_controlpath_token
   //          <<<< AUTO GENERATED HEADER END >>>>>>    );
```

Interface name: "HeaderBuffer Write Interface"

| Signal name | Direction | Size |
|---|---|---|
| parser_hdr_buff_ch<3-0>_wr_srdy | output | 1 |
| parser_hdr_buff_ch<3-0>_wr_drdy | input | 1 |
| parser_hdr_buff_ch<3-0>_wrdata.wr_lane_id | output | 2 |
| parser_hdr_buff_ch<3-0>_wrdata.wr_line_num | output | 2 |
| parser_hdr_buff_ch<3-0>_wrdata.wr_eoh | output | 1 |
| parser_hdr_buff_ch<3-0>_wrdata.wr_addr | output | 9 |
| parser_hdr_buff_ch<3-0>_wrdata.wr_hdr_data | output | XP_DATA |
| parser_hdr_buff_ch<3-0>_wrdata.wr_context_data.reserved | output | 8 |
| parser_hdr_buff_ch<3-0>_wrdata.wr_context_data.pkt_id | output | XP_PORT_PKT_ID |
| parser_hdr_buff_ch<3-0>_wrdata.wr_context_data.num_pages_used | output | XP_MAX_PAGES_PER_PKT_LOG2 |
| parser_hdr_buff_ch<3-0>_wrdata.wr_context_data.hdrLen | output | 8 |
| parser_hdr_buff_ch<3-0>_wrdata.wr_context_data.startPtr | output | 8 |
| parser_hdr_buff_ch<3-0>_wrdata.wr_context_data.his_exists | output | 1 |
| parser_hdr_buff_ch<3-0>_wrdata.wr_context_data.tx_sample | output | 1 |
| parser_hdr_buff_ch<3-0>_wrdata.wr_context_data.tx_sampleID | output | 2 |
| parser_hdr_buff_ch<3-0>_wrdata.wr_context_data.body_ptr_vld | output | 1 |
| parser_hdr_buff_ch<3-0>_wrdata.wr_context_data.body_ptr | output | XP_PAGE_ID |
| parser_hdr_buff_ch<3-0>_wrdata.wr_context_data.pnum | output | XP_PORT_ID |
| parser_hdr_buff_ch<3-0>_wrdata.wr_context_data.layer7_hash | output | 4 |
| parser_hdr_buff_ch<3-0>_wrdata.wr_context_data.layer6_hash | output | 4 |
| parser_hdr_buff_ch<3-0>_wrdata.wr_context_data.layer5_hash | output | 4 |
| parser_hdr_buff_ch<3-0>_wrdata.wr_context_data.layer4_hash | output | 4 |

FIG. 6A

| Description |
| --- |
| SRDY for a standard srdy-drdy interface. |
| DRDY for a standard srdy-drdy interface. |
| Only used in MRE -> HdrBuff path, will be hardcoded in the Parser -> HdrBuff path. |
| Line number of this header. The line number can be 0, 1, or 2 |
| End of header for this packet. Also used to qualify the context data |
| Address where the header should be stored. Hdr Buff combines this with lineNum to identify final address |
| Header Data for the transaction. |
| For future fields |
| per port packet id |
| Number of pages used by body of the packet |
| Entire Header Length -1. 0 => 1Byte header, FF => 256 bytes |
| Start of layer0. Should be 0 for most cases and 34 if XPH exists |
| HTS- Hier Timestamp exists |
| Extracted from XPH header by parser. Sent to TxDMA by rewrite |
| Extracted from XPH header by parser. Sent to TxDMA by rewrite |
| Indicates the body_ptr is valid |
| Pointer to the body of the packet |
| Port number |
| Layer hash for Layer 7 |
| Layer hash for Layer 6 |
| Layer hash for Layer 5 |
| Layer hash for Layer 4 |

FIG. 6B

APPROACH FOR LOGIC SIGNAL GROUPING AND RTL GENERATION USING XML

FIELD OF THE INVENTION

Embodiments of the present invention generally relate to the field of electronic design automation tools for integrated circuit design. More specifically, embodiments of the present invention relate to electronic design automation tools for generating an RTL description.

BACKGROUND OF THE INVENTION

In the field of digital circuit design, design abstractions are used to simplify and automate aspects of the design process of digital circuits. One of the most common design abstractions in digital circuit design is a register-transfer level (RTL) description, which models a digital circuit based on the flow of digital signals (data) between hardware registers and logical operations that are performed on those digital signals. This level of abstraction is a higher level of abstraction than the transistor level and the logic gate level, for example.

An RTL abstraction is used by hardware description languages (HDLs) to generate lower-level logical representations of the digital circuits modeled by an RTL description. Verilog and VHDL are two of the most common HDLs used today. Using HDLs, designers declare the registers and describe the combination logic using constructs such as if-then-else and arithmetic operations. An RTL description is typically converted to a gate-level description of the digital circuit using a logical synthesis tool. The gate-level description is then used by placement and routing tools to generate a physical layout, and logical simulation tools may be used to verify the integrity of an RTL description.

An RTL description typically consists of a hierarchy of modules. The modules communicate with each other using a set of declared input, output, and bidirectional interfaces. A module may perform a particular function, or store and/or transmit signals (e.g., data) to other modules, for example.

With regard to FIG. 1, an exemplary integrated circuit (IC) 100 comprising functional blocks is depicted according to embodiments of the present invention. A plurality of discrete functional blocks (e.g., blocks 101-104) are placed on a surface of IC 100 during a floor planning design stage. A series of wires/tubes (e.g., wire 105) provides top-level routing between the functional blocks to support a plurality of interfaces. The interfaces (e.g., interface 106) enable communication between the functional blocks using the wires. A functional block may be represented as a module using high-level design tools, and the connections between the modules are defined as interfaces.

In one common design scenario, two functional blocks may perform the same function, but differences in placement, routing, and/or orientation may require physically differences between the modules. For example, functional block 101 and 104 both represent a CPU of a multi CPU chip. While these CPUs are functionally identical, differences in placement and routing requires that the CPUs have physically/structural differences. There is no existing technique for defining logical signals between modules in such a way that the physical components can be reused without implementing physical changes to accommodate different placements, routings, and orientations. Reusing identical hardware components is desirable because it saves fabrication costs and reduces design complexity.

Tools such as Verilog can be used to define buses as module ports, but the concept of logical interfaces is not supported. SystemVerilog is a combined hardware description language and hardware verification language based on extensions to Verilog. However, not all design tools support SystemVerilog constructs, which are often inherently limited to SystemVerilog (e.g., not portable). As such, in Verilog, instances of RTL modules are currently populated by hand without the automation provided by encapsulating module connectivity and functionality using structured code.

SUMMARY OF THE INVENTION

Accordingly, embodiments of the present invention provide a novel approach to RTL description generation based on logical signal groupings. Logical interfaces are declared in a compressed form, and groups of logical signals are defined in a markup/structured document. The definitions from the markup document are used by expansion scripts to populate RTL modules and encapsulate block connectivity and functionality. Multiple interfaces can be created instantly, and interface definitions for common interfaces may be easily re-defined. Default values may be assigned to module outputs for testing purposes, allowing for multi-module simulations where certain modules are shelled-out (e.g., black box testing).

Embodiments of the present invention include a method for generating a register transfer level (RTL) description using logical signal grouping. The method includes generating a plurality of logical interface definitions, where the logical interface definitions define a signal from an output module to an input module and comprise an interface rule. A data structure is defined in a structured document, where the data structure comprises a first set of logical interfaces. An expansion script is used to generate an RTL description using the structured document, where the RTL description comprises a plurality of RTL modules that communicate using the logical interface definitions, and where the RTL description is populated based on the logical interface definitions, the interface rule, and the data structure.

Another embodiments of the present invention describes a system including at least one processor and at least one computer-readable storage device having instructions that when executed cause performance of a method for generating a register transfer level (RTL) description using logical signal grouping. The method includes generating a plurality of logical interface definitions, where the logical interface definitions define a signal from an output module to an input module and comprise an interface rule. A data structure is defined in a structured document, where the data structure comprises a first set of logical interfaces. An expansion script is used to generate an RTL description using the structured document, where the RTL description comprises a plurality of RTL modules that communicate using the logical interface definitions, and where the RTL description is populated based on the logical interface definitions, the interface rule, and the data structure.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 3B is a diagram illustrating exemplary RTL modules populated using a structured document according to embodiments of the present invention.

FIG. 6A is a diagram illustrating an exemplary HTML file documenting signals of an exemplary IC design according to embodiments of the present invention.

FIG. 6B is a diagram illustrating an exemplary HTML file documenting signals of an exemplary IC design according to embodiments of the present invention.

DETAILED DESCRIPTION

Figure 1:
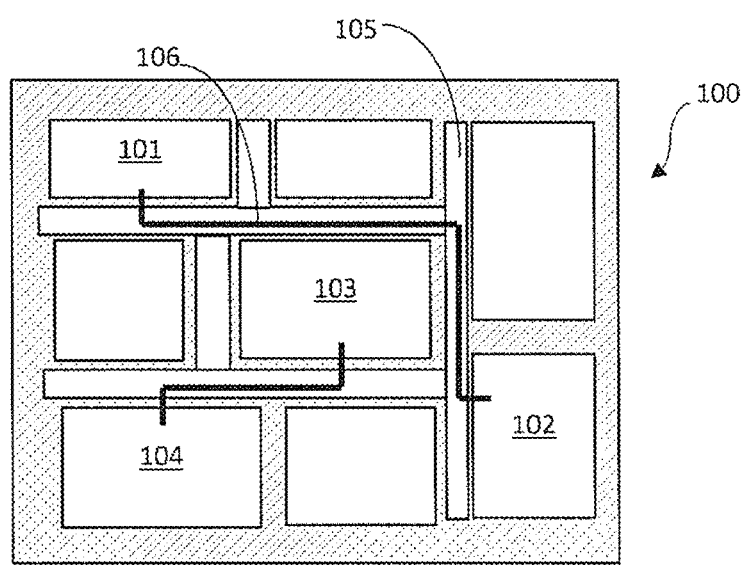
FIG. 1 is a block diagram illustrating an exemplary integrated circuit (IC) 100 comprising functional blocks according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Embodiments are well suited to performing various other steps or variations of the steps recited in the flowchart of the figures herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computing device. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "reading," "associating," "identifying" or the like, refer to the action and processes of an electronic computing device that manipulates and transforms data represented as physical (electronic) quantities within the system's registers and memories into other data similarly represented as physical quantities within the system memories or registers or other such information storage, transmission or display devices. While the markup language "XML" is referenced throughout the document, any structured (e.g., markup) document may be used for defining logical interfaces and structs within the scope of the present invention.

In the foregoing detailed description of embodiments of the present invention, numerous specific details have been set forth in order to provide a thorough understanding of the present invention. However, it will be recognized by one of ordinary skill in the art that the present invention is able to be practiced without these specific details. In other instances, well-known methods, procedures, components, and circuits have not been described in detail so as not to unnecessarily obscure aspects of the embodiments of the present invention. Although a method is able to be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part.

Logical Signal Grouping for Automatically Populating RTL Modules

Figure 2:
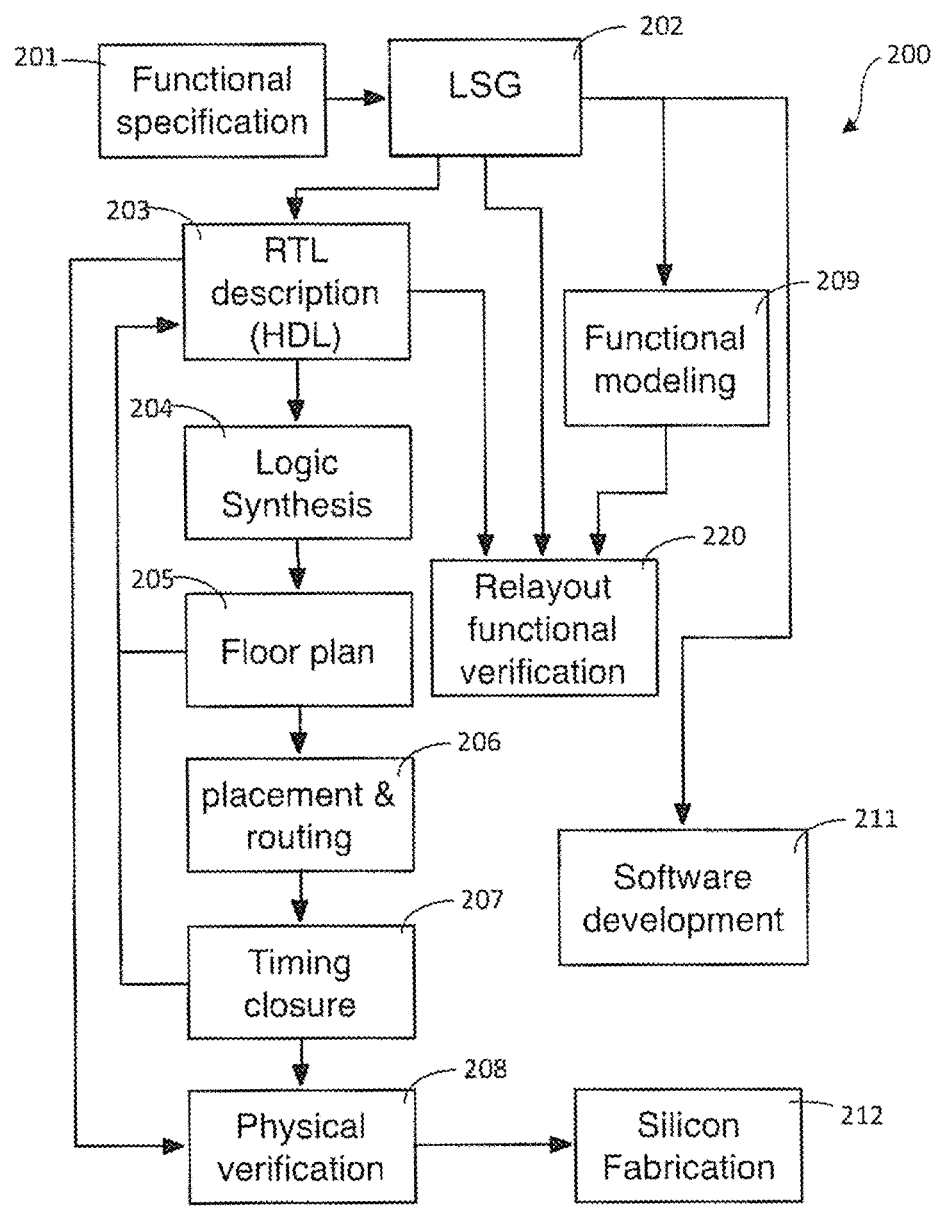
FIG. 2 is a flow chart illustrating an exemplary integrated circuit top-down design flow 200 for designing and fabricating integrated circuits using logical signal grouping (LSG) according to embodiments of the present invention.

With regard to FIG. 2, an exemplary integrated circuit top-down design flow 200 for designing and fabricating integrated circuits using logical signal grouping (LSG) is depicted according to embodiments of the present invention. The top-down procedure begins at step 201 by creating a functional specification, where the fundamental behavior of the IC is represented in an electronic system-level design. The functional specification identifies what is to be built and how it should be tested. Languages and tools used to create functional specifications include C/C++, SystemC, SystemVerilog, Simulink, and MATLAB. Embodiments of the present invention are generally compatible with any programming language that can be used to generate objects. At step 202, logical signal grouping is used to generate structured code based on the descriptive functional specification and provides maximum insulation of internal functions from outside communication. This process is detailed according to embodiments of the present invention with regard to FIGS. 3A-B, below.

The structured code generated in step 202 encapsulates block connectivity and functionality, and is used as a common global document for RTL design/generation 203, verification 210, functional modeling 209, and software development 211. The structured code may be considered an expansion of current RTL design tools (e.g., Verliog). The RTL generated using logical signal grouping in step 203 undergoes logic synthesis 204 and floor planning 205. Floor planning 205 may proceed to placement and routing 206, or return to RTL description generation 203 if the RTL description does not satisfy a physical specification requirement for floor planning 205. After placement and routing 206, timing closure 207 is performed and may return to RTL generation 203 if component timings cannot be reconciled. After timing closure 207 is complete, physical verification 108 is performed, and the process ends with silicon fabrication 212.

Figure 3A:
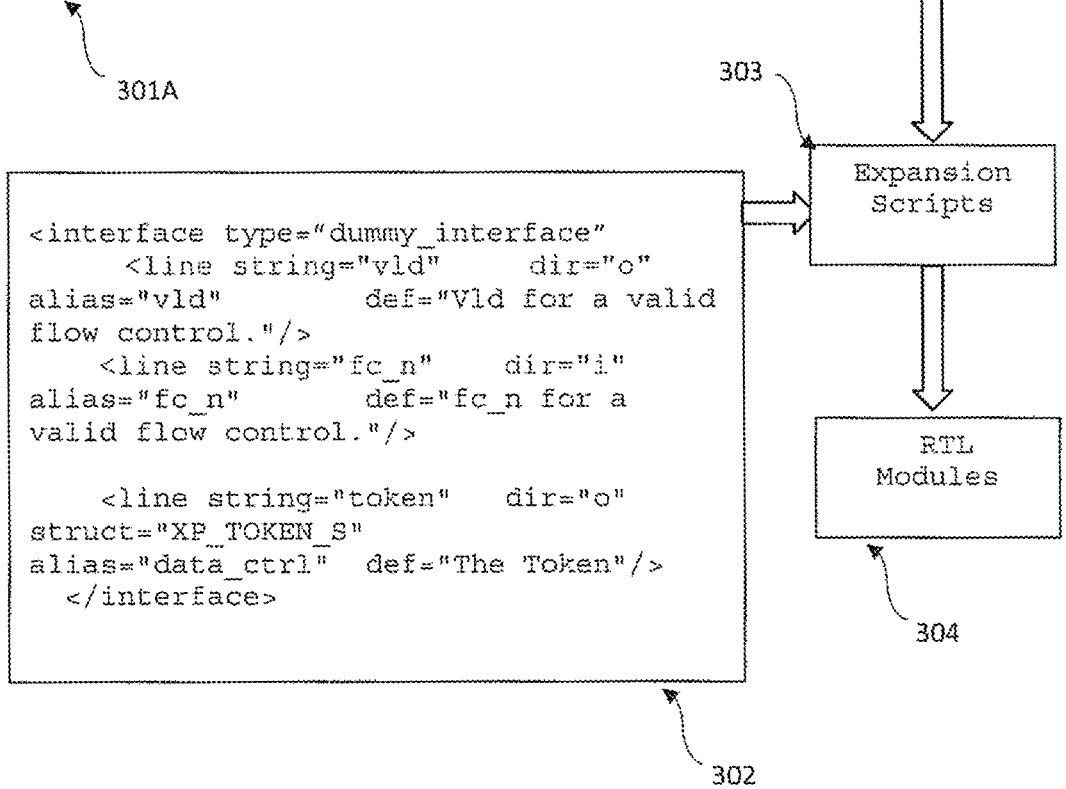
FIG. 3A is a diagram illustrating exemplary logical interface definitions and an exemplary structured document used by expansion scripts to populate RTL modules according to embodiments of the present invention.

With regard to FIG. 3A, an exemplary RTL description 301A comprising logical interface definitions is depicted according to embodiments of the present invention. Interface definitions generally indicate the type of information that one module sends to another (with the exception of flow control signals). A module "arbiter" is declared with two exemplary interfaces. In this case, both interfaces are given the name "Sample Interface" and declared as dummy interfaces. The num_inst field is used to define how many instances of an interface are to be generated. In this case, the num_inst of the first declared interface is set to 2, and the num_inst of the second declared interface is set to 1. The logical interfaces are bi-directional. The mod a field is used to define which module the interface sends data to, and the mod b field is used to define which module the interface receives data from. As depicted in FIG. 3A, the first declared interface sends data to a data path and receives data from within the arbiter module. The second declared interface sends data within the arbiter module and receives data from a control path.

Exemplary structured document 302 is used to define logical signal groupings for the logical interfaces declared in RTL description 301. The structured document may use XML, SGML, JSON, or CSV, for example, although any type of structured document may be used. An exemplary group of logical signals for the dummy_interface logical interface is defined in structured document 302 and comprises two defined signals. A string field is used to identify/name each signal individually. A dir field defines whether the signal represents an input ("i") or an output ("o") signal. An alias field is used to define the signal type (e.g., flow control, data control, start of transfer, end of transfer, valid, synchronous ready, etc.) and defines a functionality or use of the signal (e.g., for verification purposes). An output signal vld is included and is used for validating a valid flow control interface. An input signal fc_n is included and defines a flow control signal for a valid flow control interface. The signal groupings defined in structured document 302 are used to populate RTL modules 304 using expansion scripts 303.

A struct XP_TOKEN_S is also defined in structured document 302. A struct is a group of many signals or buses within an RTL and may be used for design and debugging purposes. Structs may be defined in a structured document in any arrangement (e.g., before or after parent structs). Structs use a static memory space and are portable (can be moved from one design to another). For example, the values of one struct may be assigned to another struct. In this case, the struct XP_TOKEN_S is defined as a grouping of output signals of the defined dummy_interface. The grouping of signals and buses inside the struct can be referenced as objects and values can be assigned to those objects. For example, a signal b2 of StructA can be assigned the value of a signal b4 of StructB using the command StructA.b2=StructB.b4. Once defined, strucs can be automatically generated and grouped together. Rather than defining each signal or bus of a defined struct individually, the struct can be used to save vast amounts of time and effort by simply referencing the struct and automatically generating the appropriate signals and buses.

With regard to FIG. 3B, an exemplary RTL description 301B with RTL modules populated using structured document 302 is depicted according to embodiments of the present invention. RTL modules 304 are populated and included in an auto generated header of RTL description 301B. The first two instances are generated based on the first defined dummy_interface and one instance is generated based on the second dummy_interface. The interfaces of each module are generated based on the RTL interface definitions and the logical signal grouping from the structured document. For example, the RTL interface definition of the first instance (instance 0) of the first dummy_interface includes "mod a=datapath@", where @ is associated with an instance number, and mod b=arbiter. The logical signal grouping in the structured document includes an output "vld" signal and an input "fc_n" signal, as well as an output struct "token". Therefore, the expansion script generates a first instance (instance 0) comprising an output signal to datapath0_arbiter_vld, an input signal to datapath0_arbiter_fc_n, and an output signal to datapath0_arbiter_token, where token is a struct representing many logical signals or buses. The expansion script generates a second instance (instance 1) comprising an output signal to datapath1_arbiter_vld, an input signal to datapath1_arbiter_fc_n, and an output signal to datapath1_arbiter_token.

The logical signal grouping defined in the structured document is used to quickly and conveniently populate RTL modules with potentially several (e.g., 10 or more) interfaces. For example, a logical interface may be defined as a non-inverted interface and used to automatically generate multiple instances in RTL modules. At a later time, it may be necessary to change the logical interface to an inverted interface for design purposes. The instances populating the RTL modules must be changed accordingly. Rather than altering each instance in the RTL module by hand, because the logical signals are grouped and intra-module communications have been defined, the necessary changes to the RTL modules are made automatically using expansion scripts based on the structured document.

As described above, minimal effort is needed to change interface definitions. This is especially true for interfaces that are common across many modules, such as system and config chain interfaces.

TABLE I

| |
| --- |
| //~~ name="Config Chain Out" type=config_chain inv=no num_inst=1 moda=parser_o_cfg |
| //~~ name="Config Chain In" type=config_chain inv=yes num_inst=1 moda=parser_i_cfg |

Exemplary logical interfaces Config Chain Out and Config Chain In are first declared in an RTL description. Table I reproduces these logical interface definitions. As declared, the Config Chain Out interface is non-inverted and is connected to parser_o_cfg. Config Chain In is inverted and is connected to parser_i_cfg.

TABLE II

```
<interface type="config_chain">
<line string="chain_drdy"      dir="i"  alias="drdy" def="Drdy for a
standard srd/drdy interface"/>
    <line string="chain_srdy"  dir="o"  alias="srdy"    def="Srdy for a
standard srd/drdy interface"/>
    <line string="chain_sf"    dir="o"  alias="sop"     def="Start of
transfer"/>
    <line string="chain_ef"    dir="o"  alias="eop"     def="End of
transfer"/>
    <line string="chain_val"   dir="o"  size=""XP_CONF_SZ"
alias="data_ctrl"   def="Config chain cntrl/data bus. Data and control
information is multiplexed on this bus."/>
  </interface>
```

An exemplary logical signal grouping (e.g., bus) for interface config_chain is defined in Table II. The config_chain bus includes an input signal chain_drdy, and output signals chain_srdy, chain_sf, chain_ef, and chain_val. Each signal is associated with a protocol and a description def. To add an additional control signal, a new entry is added to the definition and the new connection in automatically added to every module in the design. Similarly, to change the protocol used for this bus, the protocol type is modified and every module in the design is adjusted accordingly.

Figure 4:
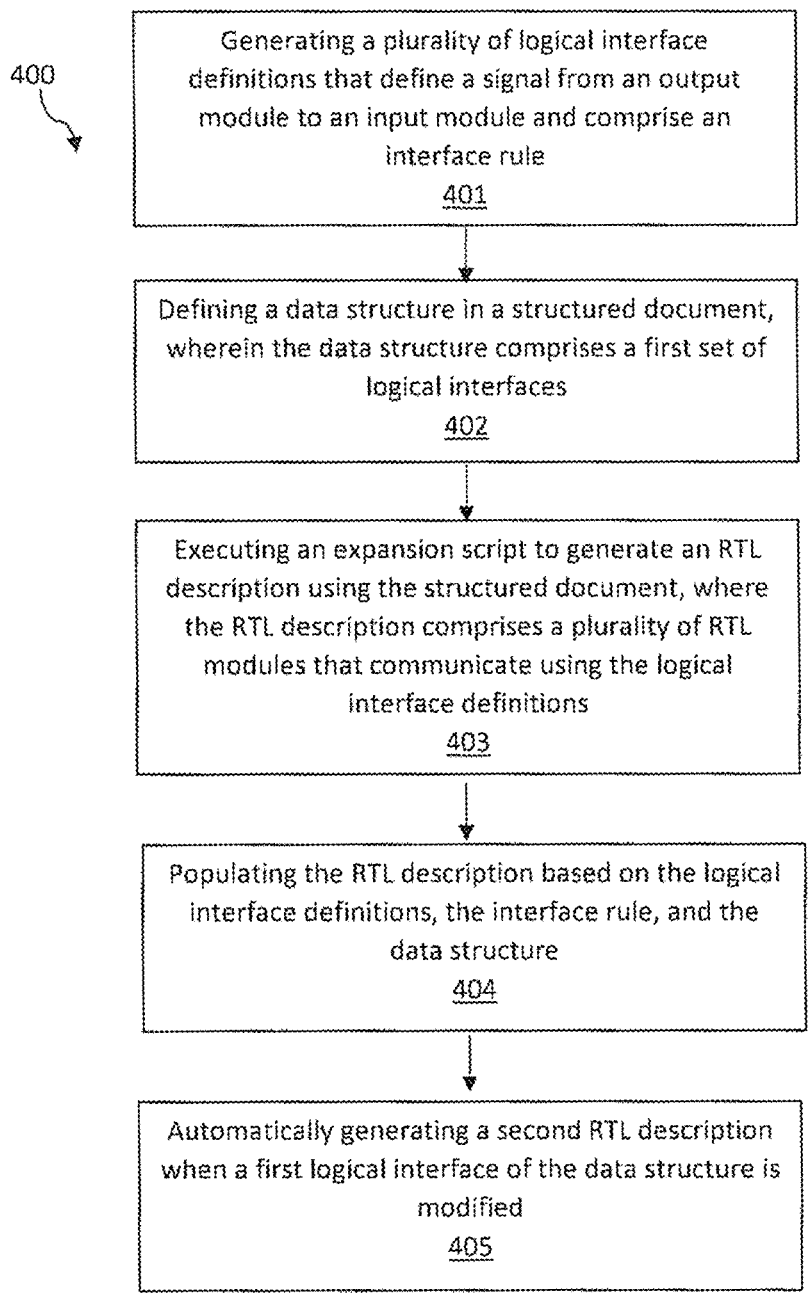
FIG. 4 is a flow chart illustrating exemplary computer implemented steps 400 for automatically populating RTL modules with interfaces based on logical signal grouping according to embodiments of the present invention

With regard to FIG. 4, a flow chart illustrating exemplary computer implemented steps 400 for automatically populating RTL modules with interfaces based on logical signal grouping is depicted according to embodiments of the present invention. At step 401, logical interface definitions that define a signal from an output module to an input module and comprise an interface rule are generated. At step 402, a data structure is defined in a structured document (e.g., an XML file), wherein the data structure comprises a first set of logical interfaces. An expansion script is executed at step 403 to generate an RTL description using the structured document, where the RTL description comprises a plurality of RTL modules that communicate using the logical interface definitions. At step 404, the RTL description is populated based on the logical interface definitions, the interface rule, and the data structure. According to some embodiments, step 405 is performed, where a second RTL description is automatically generated when a first logical interface of the data structure is modified.

Shelling-Out Modules for Simulation

Figure 5:
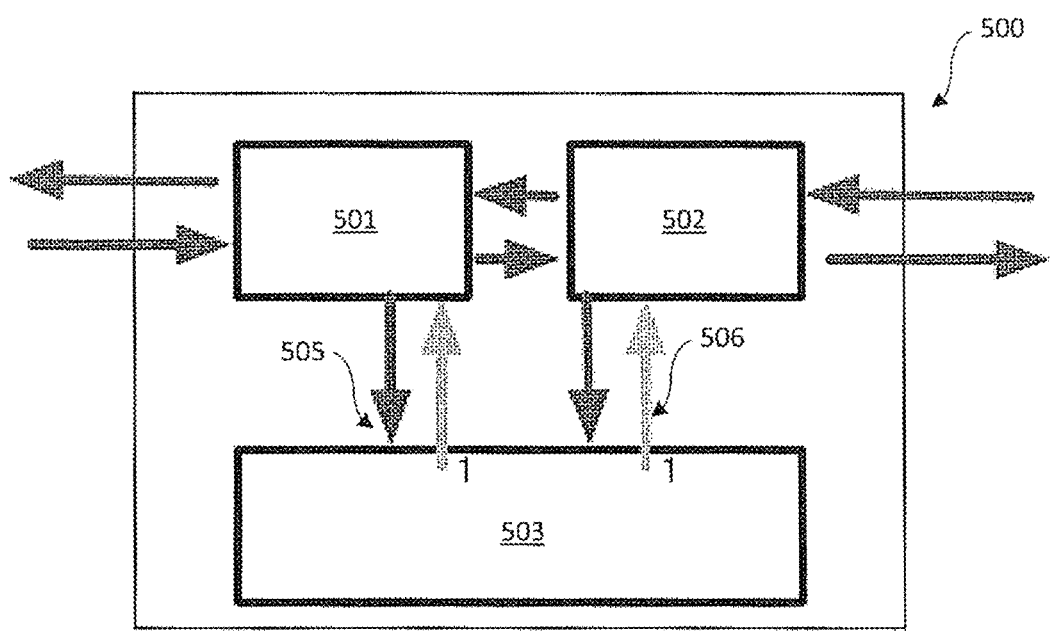
FIG. 5 is a block diagram illustrating an exemplary integrated circuit comprising a series of exemplary modules according to embodiments of the present invention.

With regard to FIG. 5, an exemplary integrated circuit 500 comprising a set of modules is depicted according to embodiments of the present invention. The automatic generation of module interfaces discussed above enables the assignment of default values to interfaces. This is especially useful for shelling-out certain modules for testing purposes. This may be considered a form of "black box" testing, where certain modules are essentially ignored during simulations. In the example of FIG. 5, the output of modules 501 and 502 are to be simulated for diagnostics purposes. Module 503 is not to be tested; however, modules 501 and 502 must receive input from module 503 using interfaces 505 and 506, respectively, in order to function properly. If module 503 is removed, the data received by modules 501 or 502 is unpredictable. In this case, an error is likely to occur, resulting in a failed simulation. Therefore, it is beneficial to assign default values (e.g., '1') to the outputs of module 503 that is communicated over interfaces 505 and 506. This is accomplished simply by removing the desired module from the RTL description and assigning default values to the related interfaces in the structured document used to define the signals.

Interface Assertions

Interface assertions and checks can be automatically generated based on the logical interfaces referenced in a structured document. During simulation, an interrupt/assertion is thrown when a defined rule is violated. Assertions are used to detect errors early in the design process to reduce debug time later in the process. Assertions are especially useful for detecting bus protocol errors.

TABLE III

```
//        <<<< AUTO GENERATED ASSERTIONS BEGIN >>>>
//
// urw_cmd0_se_dispatch_direct_m, instance 0
'ASSERT_SDRDY(ERROR_SVA_URW_CMD-0-SE-M-SDRDY0, {urw_cmd_sdry},
{urw_cmd_0_drdy});
'ASSERT_SRDY_DATA(ERROR_SVA_URW_CMD_0_SE_M_SRDY_DATA0, {urw_cmd_o_srdy},
{urw_cmd_0_code});
'ASSERT_STABLE_DATA(ERROR_SVA_URW_CMD_0_SE_M_STABLE_DATA0, {urw_cmd_0_srdy},
{urw_cmd_0_drdy}, {urw_cmd_0_code});
```

Table III depicts automatically generated assertions based on an exemplary structured document and interface definitions. The assertions are represented as code that is expanded using a macro based on the signals and structs of a structured document. The assertions may be automatically inserted into an RTL as in-line diagnostics code.

Interface Definitions for Software Design

Where RTL identifies interface transactions to determine what data is being communicated between modules, software designers views interfaces as objects that can be moved and assigned values. Interface definitions are the source for creating data structures used in whitemodels. Structs comprising multiple signals and buses can be described in a structured document and treated as objects for this purpose. For example, a signal b2 of StructA can be assigned the value of a signal b4 of StructB using the command StructA.b2=StructB.b4. Automatically generating structs using a structured document greatly simplifies the process of whitemodel generation based on interface definitions.

Verification Applications

From the interface definitions previously described, various types of objects can be generated based on the desired application. The data structures used in SystemC, for example, closely mimic the interface definitions in RTL. The above described approaches to logical signal grouping can be used to create objects for verification purposes. This enables easy bit-level manipulation in SystemC. For methodologies like Universal Verification Methodology (UVM), sequence items can be generated, thereby enabling data randomization, error testing, and the use of generic drivers and monitors. SystemVerilog interfaces are also generated to easily connect RTL to Testbench for simulation.

Automatic Generation of Documentation

The vast quantity of interfaces and structs automatically generated using embodiments of the present invention makes proper documentation critical for designers. With regard to FIG. 6A, an exemplary HTML file 600 documenting the signals of an exemplary IC design is depicted according to embodiments of the present invention. HTML file 600 is automatically generated based on the interface definitions of an RTL description and the logical signal groupings of a structured document. The HTML file includes a list of signal names 601, signal directions 602, and signal size 603. Each signal is associated with a unique signal name. The direction of the signal is described as an input or an output signal. A size value associated with the signal is indicated by a variable (e.g., 'XP_PAGES_PER_PKT_LOG2) or an integer. FIG. 6B illustrates a list of signal descriptions 604 of HTML file 600 according to embodiments of the present invention. The signal descriptions indicate what the signal is and/or what the signal can be used for.

Embodiments according to the present disclosure are thus described. While the present disclosure has been described in particular embodiments, it is intended that the invention shall be limited only to the extent required by the appended claims and the rules and principles of applicable law.

What is claimed is:

1. A method, performed by a processor, for generating a register transfer level (RTL) description using logical signal grouping, the method comprising:
   generating a plurality of logical interface definitions, wherein the plurality of logical interface definitions define signals from an output module to an input module and comprise an interface rule;
   defining a data structure in a structured document, wherein the data structure comprises a first set of logical interfaces, and wherein the structured document is used to define the logical signal grouping for each logical interface of the first set of logical interfaces;
   executing an expansion script to generate a first RTL description using the structured document, wherein the first RTL description comprises a plurality of RTL modules that communicate using the plurality of logical interface definitions, wherein the first RTL description is populated based on the plurality of logical interface definitions, the interface rule, the logical signal grouping defined in the structured document, and the data structure, and wherein the generated first RTL description facilitates reuse of physical components of an integrated circuit (IC) without implementing physical changes to the physical components to accommodate different placements, routings, and orientations;
   modifying a first logical interface from the first set of logical interfaces of the data structure to automatically generate a second RTL description based on the expansion script using the data structure defined in the structured document;
   assigning a default value to a first output of a first RTL module of the plurality of RTL modules and testing a second RTL module of the plurality of RTL modules using the first output, wherein the assigning the default value comprises assigning a default value to a logical interface, related to the first RTL module, in the structured document; and
   generating objects and sequence items based on the logical signal grouping, wherein the generated objects and the generated sequence items are to be used for error testing and use of drivers and monitors.

2. The method of claim 1, wherein the first set of logical interfaces are bi-directional.

3. The method of claim 1, further comprising assigning a default value to a control signal of the first set of logical interfaces.

4. The method of claim 1, further comprising automatically generating a documentation file comprising a direction, a size, and a description of the signals.

5. The method of claim 1, wherein the structured document is an XML, file.

6. The method of claim 1, wherein the first RTL description comprises structured HDL code.

7. The method of claim 1, wherein the first RTL description comprises an automatically generated struct comprising a plurality of signals.

8. The method of claim 1, further comprising automatically generating an assertion based on the structured document for testing a condition of the first RTL module of the plurality of RTL modules.

9. A computer program product tangibly embodied in a computer-readable storage device and comprising instructions, that when executed by a processor, perform a method for generating a register transfer level (RTL) description using logical signal grouping, the method comprising:
   generating a plurality of logical interface definitions, wherein the plurality of logical interface definitions define signals from an output module to an input module and comprise an interface rule;
   defining a data structure in a structured document, wherein the data structure comprises a first set of logical interfaces, and wherein the structured document is used to define the logical signal grouping for each logical interface of the first set of logical interfaces;
   executing an expansion script to generate a first RTL description using the structured document, wherein the first RTL description comprises a plurality of RTL modules that communicate using the plurality of logical interface definitions, wherein the first RTL description is populated based on the plurality of logical interface definitions, the interface rule, the logical signal grouping defined in the structured document, and the data structure, and wherein the generated first RTL description facilitates reuse of physical components of an integrated circuit (IC) without implementing physical changes to the physical components to accommodate different placements, routings, and orientations;
   modifying a first logical interface from the first set of logical interfaces of the data structure to automatically generate a second RTL description based on the expansion script using the data structure defined in the structured document;
   assigning a default value to a first output of a first RTL module of the plurality of RTL modules and testing a second RTL module of the plurality of RTL modules using the first output, wherein the assigning the default value comprises assigning a default value to a logical interface, related to the first RTL module, in the structured document; and
   generating objects and sequence items based on the logical signal grouping, wherein the generated objects and the generated sequence items are to be used for error testing and use of drivers and monitors.

10. The method of claim 9, wherein the first set of logical interfaces are bi-directional.

11. The method of claim 9, further comprising assigning a default value to a control signal of the first set of logical interfaces.

12. The method of claim 9, further comprising automatically generating a documentation file comprising a direction, a size, and a description of the signals.

13. The method of claim 9, wherein the structured document is an XML file.

14. The method of claim 9, wherein the first RTL description comprises structured HDL code.

15. The method of claim 9, wherein the first RTL description comprises an automatically generated struct comprising a plurality of signals.

16. The method of claim 9, further comprising automatically generating an assertion based on the structured document for testing a condition of the first RTL module of the plurality of RTL modules.

17. A system comprising:
at least one processor; and
at least one computer-readable storage device comprising instructions, that when executed by the at least one processor, cause performance of a method for generating a register transfer level (RTL) description using logical signal grouping, the method comprising:
generating a plurality of logical interface definitions, wherein the plurality of logical interface definitions define signals from an output module to an input module and comprise an interface rule;
defining a data structure in a structured document, wherein the data structure comprises a first set of logical interfaces, and wherein the structured document is used to define the logical signal grouping for each logical interface of the first set of logical interfaces;
executing an expansion script to generate a first RTL description using the structured document, wherein the first RTL description comprises a plurality of RTL modules that communicate using the plurality of logical interface definitions, wherein the first RTL description is populated based on the plurality of logical interface definitions, the interface rule, the logical signal grouping defined in the structured document, and the data structure, and wherein the generated first RTL description facilitates reuse of physical components of an integrated circuit (IC) without implementing physical changes to the physical components to accommodate different placements, routings, and orientations;
modifying a first logical interface from the first set of logical interfaces of the data structure to automatically generate a second RTL description based on the expansion script using the data structure defined in the structured document;
assigning a default value to a first output of a first RTL module of the plurality of RTL modules and testing a second RTL module of the plurality of RTL modules using the first output, wherein the assigning the default value comprises assigning a default value to a logical interface, related to the first RTL module, in the structured document; and
generating objects and sequence items based on the logical signal grouping, wherein the generated objects and the generated sequence items are to be used for error testing and use of drivers and monitors.

18. The method of claim 17, wherein the first set of logical interfaces are bi-directional.

19. The method of claim 17, further comprising assigning a default value to a control signal of the first set of logical interfaces.

20. The method of claim 17, further comprising automatically generating a documentation file comprising a direction, a size, and a description of the signals.

21. The method of claim 17, further comprising automatically generating an assertion based on the structured document for testing a condition of the first RTL module of the plurality of RTL modules.

22. The method of claim 17, wherein the structured document is an XML file.

23. The method of claim 17, wherein the first RTL description comprises structured HDL code.

24. The method of claim 17, wherein the first RTL description comprises an automatically generated struct comprising a plurality of signals.

25. The method of claim 1, further comprising, in response to changing a first logical interface definition of the plurality of logical interface definitions, wherein the first logical interface definition is in multiple RTL modules of the plurality of RTL modules: automatically changing, as a group, each instance of the first logical interface definition in each RTL module of the multiple RTL modules.

* * * * *